United States Patent [19]

Roberts

[11] Patent Number: 4,973,948
[45] Date of Patent: Nov. 27, 1990

[54] REVERSED OR MISSING LEAD FRAME DETECTOR

[75] Inventor: Jay W. Roberts, Boise, Id.
[73] Assignee: Micron Technology, Inc., Boise, Id.
[21] Appl. No.: 470,597
[22] Filed: Jan. 26, 1990
[51] Int. Cl.[5] ............................................. G08B 21/00
[52] U.S. Cl. .................. 340/653; 324/158 F; 324/555; 29/593; 361/421; 340/653
[58] Field of Search .......... 340/686, 687, 653; 324/158 F, 555, 556; 29/593; 361/421

[56] References Cited

U.S. PATENT DOCUMENTS

| | | | |
|---|---|---|---|
| 3,838,984 | 10/1974 | Crane et al. | 29/193.5 |
| 4,415,917 | 11/1983 | Chiba et al. | 29/60 |
| 4,651,415 | 3/1987 | Frampton | 29/827 |
| 4,721,365 | 1/1988 | Nishimura | 29/593 |
| 4,833,396 | 5/1989 | Haberland | 324/537 |

FOREIGN PATENT DOCUMENTS

| | | | |
|---|---|---|---|
| 0053272 | 6/1982 | European Pat. Off. | 29/593 |
| 0216155 | 11/1984 | German Democratic Rep. | 29/593 |

Primary Examiner—Joseph A. Orsino
Assistant Examiner—Jill Jackson
Attorney, Agent, or Firm—Hopkins, French, Crockett, Springer & Hoopes

[57] ABSTRACT

A reversed or missing lead frame apparatus that detects the presence or absence of a unique aperture by completing or opening an electrical circuit thereby providing indication or an alarm when the circuit resistance is not within an expected range of resistance values that is dependent on the total number of lead frames being tested.

12 Claims, 5 Drawing Sheets

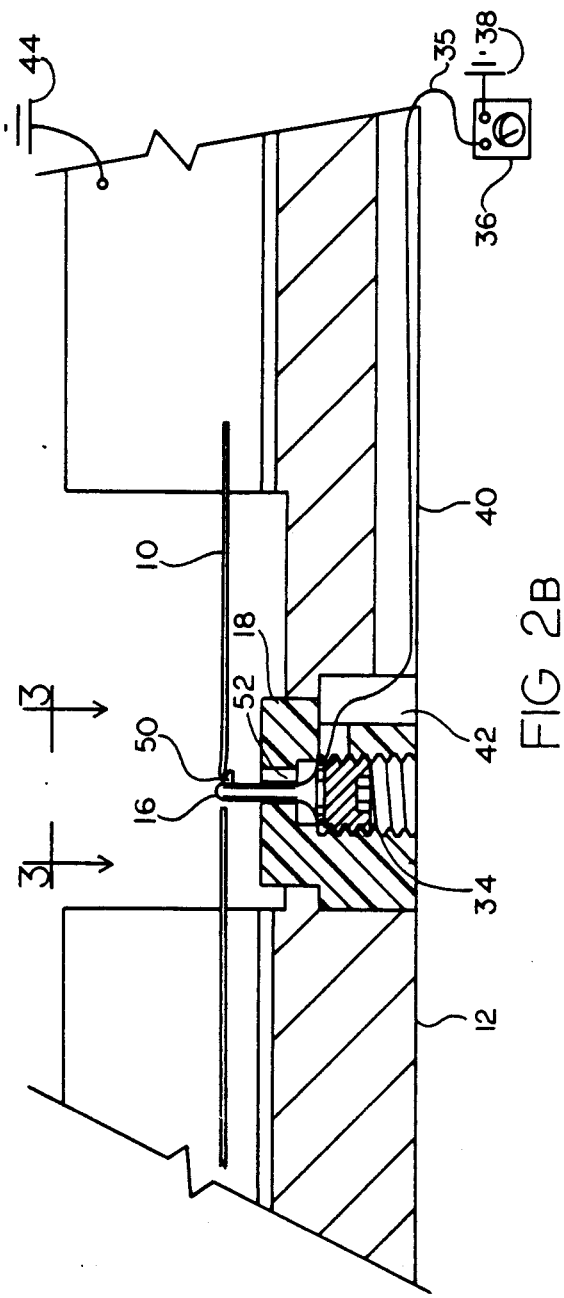

REVERSED OR MISSING LEAD FRAME DETECTOR

BACKGROUND OF THE INVENTION

This invention relates to an apparatus that identifies a reversed or missing integrated circuit (IC) lead frame by means of an electrical circuit that monitors pin contact or non-contact with the lead frame as it sets in a hot plate chase, in preparation for an encapsulation process.

The process of encapsulation of a conventional IC die comprises the following steps:
1. the dies are formed;
2. the dies are attached to a metal lead frame having a (typically, but not exclusively) oblong hole on one rail and circular "pin one" holes on the opposite rail;
3. the lead frames are guided onto a loading frame by the "hot plate chase" used to heat the lead frames;
4. the lead frames are visually inspected by an operator to verify proper orientation in the hot plate chase, i.e. the pin one holes are oriented correctly with respect to the encapsulation mold;
5. the loading frame carrier top is closed over the hot plate chase and lead frames; and
6. the loading frame carrier is transferred to the encapsulation mold for a pressurized, resin injection, encapsulation process.

The result of a reversed lead frame is that the IC dies on the lead frame will be rotated 180° from the proper orientation. For instance, the pin 9 lead will be incorrectly marked as pin 1 (on a 16 pin dual in-line package (DIP)). Additionally, a reversed lead frame will have the oblong aperture on the side where the pin 1 holes should be, causing poor alignment during encapsulation and later in the process when the lead frames are punched and the plastic package is trimmed. Misalignment in turn causes improper trimming, improper forming and most significantly, possible damage to the trimming and forming machines.

A missing lead frame will cause a complete cycle of the encapsulation process to be defective for as many as 200 or more dies, since each hot plate chase carries two lead frames, each having a plurality of dies, with as many as six to ten hot plate chase carriers mounted together on one hot plate. Defective encapsulation occurs due to low pressure in the mold since it is pumping plastic into the void that should have contained a lead frame. Not only are up to 200 or more dies rejected but the spilled plastic creates a significant maintenance problem. As noted above, the current method of monitoring for reversed dies is a visual inspection of the lead frames in the hot plate chase to verify that the lead frames have the proper pin one orientation on the hot plate. This is not a fool-proof task due to human error: the pin one holes are about 0.062 inches in diameter and the oblong apertures are typically oval-shaped with a small dimension of 0.062 inches and a long dimension of about 0.080 inches. Mistakes in visual observation are easily made.

It is the purpose of this invention to provide an apparatus that automatically monitors the hot plate chase to verify that the lead frame orientation is correct, and if a lead frame is reversed, the apparatus will provide appropriate indication or alarm means to warn the operator. A second embodiment of the invention will also detect a missing lead frame from the hot plate chase and provide appropriate indication or alarm.

SUMMARY OF THE INVENTION

In a first embodiment of the present invention, the apparatus monitors proper orientation of lead frames in a hot plate chase by means of an electrically conducting detector pin that does not make contact with an electrically grounded lead frame when the lead frame orientation is correct, since the lead frame is oriented such that a unique aperture (most commonly, circular in shape) is located directly above the detector pin, and the tip of the pin extends through this unique aperture without contacting the edges of the lead frame. The result is an open electrical circuit or infinite resistance and a no-alarm state. In the case where the lead frame is reversed from its proper orientation, the unique aperture is then located on the opposite side of the lead frame away from the detector pin and the detector pin will contact the metallic grounded lead frame, thereby closing an electrical circuit through the detector pin to a resistance meter or appropriate alarm circuit. The circuit resistance in this case is approximately zero ohms.

In a second embodiment of the invention, the apparatus will monitor proper lead frame orientation, reverse orientation and a completely missing lead frame. This is accomplished by adding a resistor device of known resistance near the tip of the detector pin such that in the case of proper lead frame orientation, the resistor contacts the edge of the unique aperture in the lead frame and the circuit resistance approximately equals that of the resistor. In the case of reverse orientation, the tip of the detector pin contacts the lead frame and the circuit resistance is approximately zero as described in the first embodiment. In the case of a missing lead frame, there is no contact with the lead frame by the detector pin and the circuit resistance is therefore infinite. Thus, there are three distinct states: a finite resistance value for proper lead frame orientation; zero resistance for a reversed lead frame; and infinite resistance for a missing lead frame.

Brief Description of the Drawings

FIG. 2B illustrates a second embodiment in a sectional view taken along lines 2—2 of FIG. 1;

Detailed Description of the Invention

Figure 1:
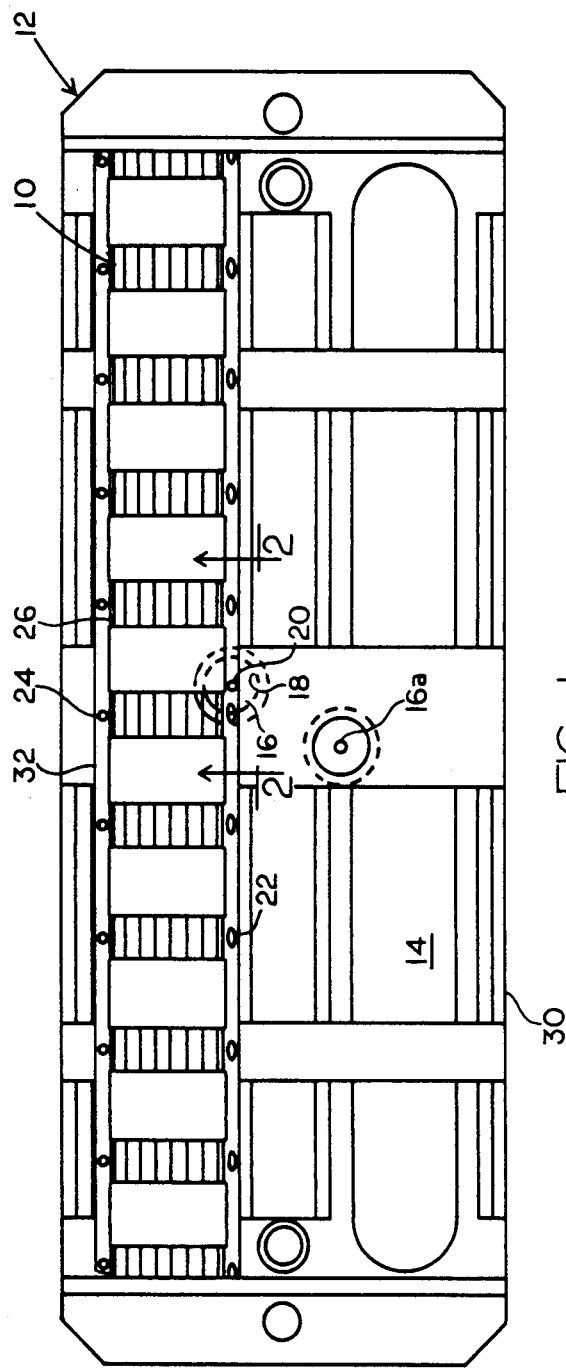
FIG. 1 illustrates in plan view one of the two lead frames installed in the hot plate chase.

Referring to FIG. 1, one of two lead frames 10 is shown inserted in an aluminum hot plate chase 12. In normal operation, a second lead frame will be inserted adjacent to lead frame 10 at position 14. A steel detector pin 16 is retained within an insulated detector pin insert 18 directly beneath (or within) a properly oriented lead frame unique aperture 20. Proper orientation of the aperture 20 about pin 16 locates one of the oblong apertures 22 near the center of the hot plate chase 12. On the side of the lead frame opposite that of the aperture 22 is one or more "pin one" apertures 24. This arrangement is necessary to insure that the "pin one lead" 26 is in the proper orientation for the package molding process. Proper orientation of a second lead frame in position 14 insures a second aperture 20 (not shown) and pin 16A are properly aligned, with the pin one leads of the second lead frame adjacent to the opposite edge 30 of the hot plate chase 12. Improper placement of either lead frame on the hot plate chase (usually, the lead frame is reversed 180° on the hot plate chase) would result in the lead frame rail 32 contacting pin 16, such that the pin one lead is adjacent the center of the hot plate chase rather than an edge thereof.

Figure 2A:
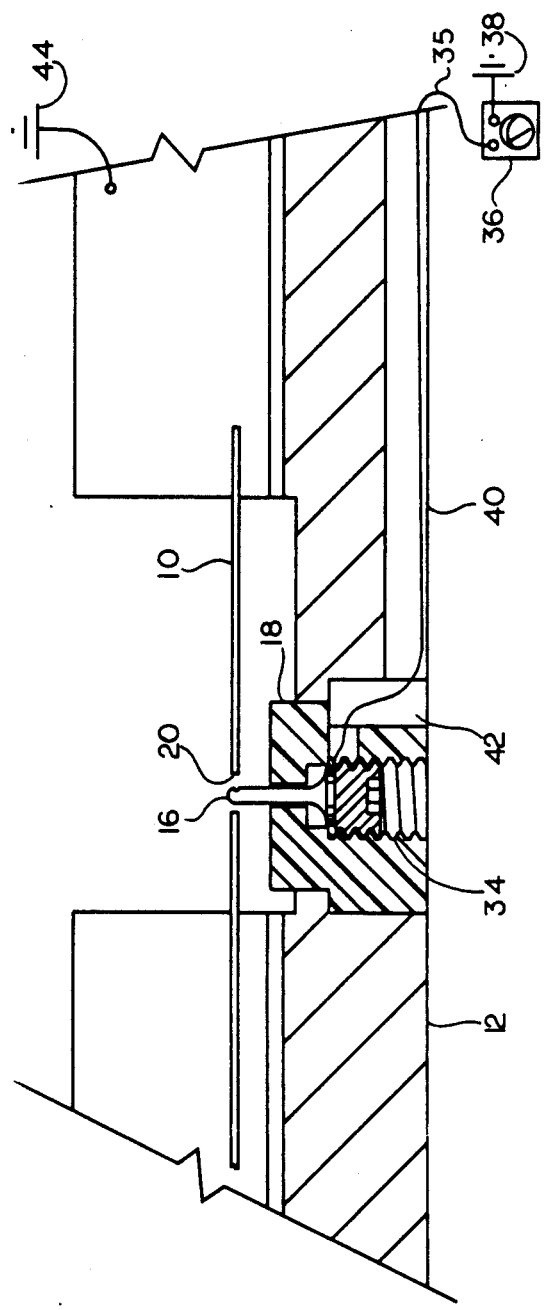
FIG. 2A illustrates a first embodiment in a sectional view taken along lines 2—2 of FIG. 1.

The section view of FIG. 2A illustrates a first embodiment of the invention wherein the detector pin 16 senses a properly oriented lead frame 10 by penetrating, but not touching the edges of, unique aperture 20 in lead frame 10. The detector pin 16 and a wire 35 are held in contact by detector pin set screw 34. The detector pin 16 is interconnected through wire 35 to an electrical circuit comprising, for example, a resistance indicator meter 36 having a meter ground 38. The wire 35 is connected to detector pin 16 through wire slot 40 in hot plate chase 12 and then through wire aperture 42 in detector pin insert 18. The circuit is completed by the metallic lead frame 10 in direct contact with the aluminum hot plate chase 12, grounded at hot plate chase ground 44. Without contact between pin 16 and lead frame 10, the circuit is open and the resistance is essentially infinity.

Figure 3:
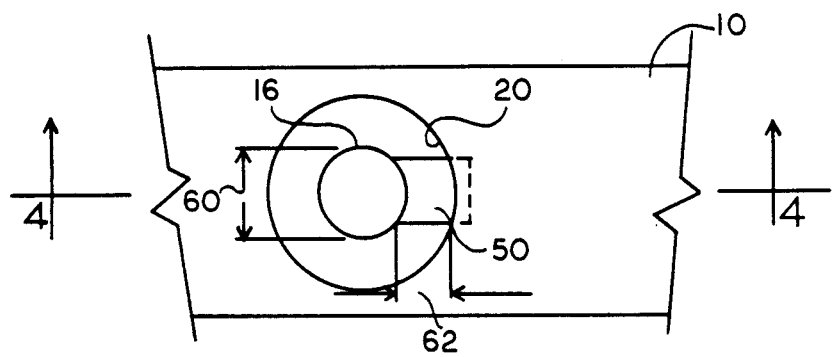
FIG. 3 is an enlarged plan view of a properly oriented lead frame, pin detector and resistor.

An alternative embodiment to that illustrated in FIG. 2A is illustrated in FIG. 2B, wherein a resistor 50 is provided on detector pin 16, and a detector pin keyway 52 in insert 18, permits inserting the resistor 50 and pin 16 through the detector pin insert 18. Whereas the embodiment of FIG. 2A illustrates the case wherein a property-oriented lead frame is indicated by an open circuit, the embodiment of FIG. 2B illustrates a situation wherein a properly-oriented lead frame is indicated by a closed circuit—that is, the resistor 50 contacts the lead frame 10 at the aperture 20. The circuit resistance in the case of the embodiment of FIG. 2B equal to the value of resistor 50. FIG. 3 is a plan view illustrating contact of resistor 50 against the edge of the unique aperture 20 in lead frame 10.

Figure 4:
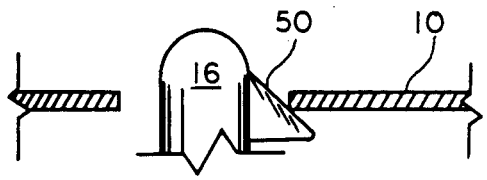
FIG. 4 is a sectional view taken along lines 4—4 of FIG. 3.

FIG. 4 illustrates in an enlarged sectional view the resistor 50 in contact with the edge of the unique aperture 20 in lead frame 10 in the properly oriented condition of the second embodiment of FIG. 2B. In FIGS. 3 and 4 the circuit resistance as indicated by the meter 36 (FIG. 2B) would be equal to the value of resistor 50.

Figure 5:
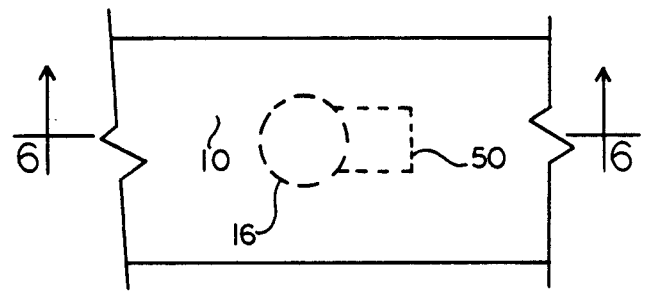
FIG. 5 is an enlarged plan view of a reversed lead frame contacting the pin detector and resistor.
Figure 6:
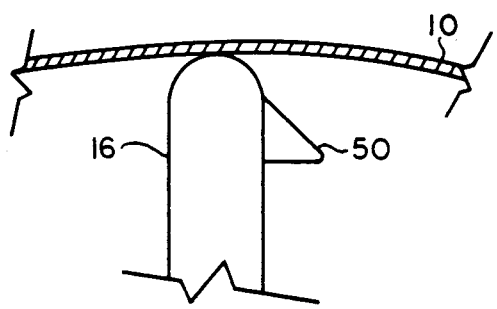
FIG. 6 is a sectional view taken along lines 6—6 of FIG. 5.

Referring to FIGS. 5 and 6, in which the lead frame 10 is reversed, the unique aperture 20 is not aligned with detector pin 16, and but rather the rail portion of the lead frame overlies the pin 16. Therefore, the top of detector pin 16, and not the resistor 50, contacts the lead frame 10. As further illustrated in FIG. 6, the detector pin 16 contacts the lead frame 10 and results in a circuit resistance of approximately zero ohms, the indication of a reversed lead frame 10. This is in contrast to a finite resistance reading that occurs when properly oriented as shown in FIGS. 3 and 4.

Figure 7:
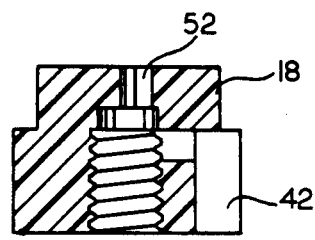
FIG. 7 illustrates the detector pin insert and the detector pin insert keyway.
Figure 8:
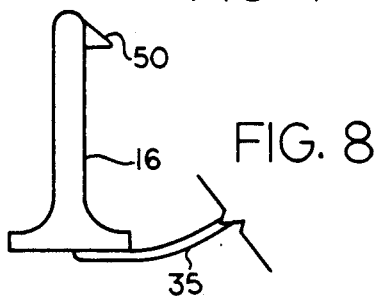
FIG. 8 illustrates the detector pin and resistor in elevation.

In FIG. 7 keyway 52 in detector pin insert 18 is required to allow the pin 16 and the resistor 50 in FIG. 2B to pass through the center of the detector pin insert 18 as assembled. FIG. 8 illustrates the resistor 50 attached to detector pin 16 contacting wire conductor 35 which is used to complete the circuit between the resistor 50, lead frame 12 and meter 36 (FIG. 2B).

The apparatus of the present invention proceeds in a six-step process as set forth above. However, rather than visually inspecting each, or a representative sample, of the lead frames, the apparatus is connected to a monitoring means, such as an ohmmeter or alarm circuit as illustrated in FIGS. 2A and 2B. In the first embodiment of FIG. 2A, electrically paralleling all switches provides an alarm or zero resistance indication if any one of the lead frames are reversed. While not illustrated herein, it is contemplated that an automatic switching circuit and scanning means may be provided to individually check each lead frame. In this first embodiment, zero ohms indicates a lead frame is reversed in the hot plate chase, and an open circuit indicates proper orientation of all lead frames.

In the second embodiment of FIG. 2B, the inspection step is similar to that of the first embodiment, in that the pin 16 is connected to an ohmmeter or alarm circuit to monitor the resistance of the circuit. However, in the second embodiment there are three possible system state conditions: a closed circuit (zero ohms) as shown in FIGS. 5 and 6, indicating a reversed lead frame(s); an intermediate known resistance indicating proper lead frame orientation as shown in FIGS. 3 and 4; and an open circuit indicating a missing lead frame. In the case where multiple circuits are connected electrically in parallel, indications would be as follows:

1. a closed circuit would indicate at least one reversed lead frame (FIG. 6);

2. a known resistance equal to 1/20th of the value of each resistor, R, (in the case where 20 lead frames are being tested and each resistor 50 (FIG. 8) has the same resistance value, R) would indicate proper lead frame orientation (FIG. 4); and 3. a resistance value greater than 1/20th of R (the value of each resistor), i.e. 1/19th of R, would indicate at least one missing lead frame.

Therefore, a circuit can be devised that alarms whenever the resistance value exceeds a certain known value (as in subparagraph 3 above), or when the resistance is approximately zero ohms (FIG. 6).

Referring to FIG. 3, a preferred detector pin 16 diameter 60 is approximately half of the diameter of the unique hole. This is applicable to both the first and second embodiment of the invention. For the second embodiment of the invention, a resistor length 62 equal to or slightly greater than the pin diameter is required in order to contact the unique aperture 20 edge on the lead frame 10.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

I claim:

1. A reversed frame detector apparatus comprising:
   a. a metal hot plate chase electrically grounded to and conductive to an integrated circuit chip lead frame;
   b. a metal detector pin carried in an insulated detector pin insert and affixed to the metal hot plate chase;

c. resistance monitoring means;
d. conducting means connecting the detector pin and a first terminal of the resistance monitoring means;
e. a grounded second terminal of the resistance monitoring means; and
f. a unique aperture in the lead frame cooperating with the detector pin, wherein when the lead frame is in a properly oriented position on the chase the detector pin interfits within the unique aperture without contact therebetween.

2. An apparatus as recited in claim 1, wherein the diameter of the detector pin is approximately one-half the diameter of the unique aperture.

3. The apparatus as recited in claim 1, wherein the resistance monitoring means is an alarm circuit that alarms when other than infinite resistance is indicated.

4. A reversed or missing lead frame detector apparatus comprising:
   a. a metal hot plate chase electrically grounded to and conductive to an integrated circuit chip lead frame;
   b. a metal detector pin carried in an insulated detector pin insert and affixed to the metal hot plate chase;
   c. a resistor affixed to an upper portion of the detector pin;
   d. resistance monitoring means;
   e. conducting means connecting the detector pin and a first terminal of the resistance monitoring means;
   f. a grounded second terminal of the resistance monitoring means; and
   g. a unique aperture in the lead frame cooperating with the detector pin such that when the lead frame is properly oriented in the hot plate chase, an appropriate resistance is indicated by the monitoring means.

5. The apparatus as recited in claim 4, wherein the monitoring means indicates a resistance of essentially infinity when a lead frame is missing.

6. The apparatus as recited in claim 4, wherein the resistance monitoring means is an alarm circuit that alarms when other than said appropriate resistance is indicated.

7. The apparatus as recited in claim 4, wherein the chase further comprises an insulated insert within which the detector pin is positioned.

8. The apparatus as recited in claim 7, wherein the insulated insert comprises a keyway for receiving the resistor.

9. The apparatus as recited in claim 4, wherein the pin cooperates with the unique aperture such that the resistor is in contact with the lead frame.

10. The apparatus as recited in claim 9, wherein the monitoring means indicates a resistance of known amount between zero and infinity.

11. The apparatus as recited in claim 4, wherein the diameter of the detector pin is approximately one-half the diameter of the unique aperture.

12. The apparatus as recited in claim 4, wherein the resistor length is equal to or slightly greater than the detector pin diameter.

* * * * *